(12) United States Patent
Gao et al.

(10) Patent No.: US 11,448,927 B2
(45) Date of Patent: Sep. 20, 2022

(54) DISPLAY DEVICE AND FABRICATION METHOD THEREOF

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Zhuan Gao, Shanghai (CN); Xinzhao Liu, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 0 days.

(21) Appl. No.: 16/828,608

(22) Filed: Mar. 24, 2020

(65) Prior Publication Data

US 2021/0191183 A1 Jun. 24, 2021

(30) Foreign Application Priority Data

Dec. 20, 2019 (CN) .......................... 201911322256.3

(51) Int. Cl.
*G02F 1/1345* (2006.01)
*G02F 1/1335* (2006.01)
(Continued)

(52) U.S. Cl.
CPC .... *G02F 1/13458* (2013.01); *G02F 1/133528* (2013.01); *G02F 1/136286* (2013.01); *H05K 1/189* (2013.01); *H05K 2201/10136* (2013.01)

(58) Field of Classification Search
CPC ... G02F 2201/56; G02F 1/13458; B32B 1/00; B32B 1/04; G04G 9/00; G04G 17/00;
(Continued)

(56) References Cited

U.S. PATENT DOCUMENTS

2016/0109861 A1* 4/2016 Kim .................... G04G 5/00 368/69
2016/0170246 A1* 6/2016 Lu ................... G02F 1/133512 349/42
(Continued)

FOREIGN PATENT DOCUMENTS

CN 108681127 A 10/2018
CN 108828856 A 11/2018
(Continued)

*Primary Examiner* — Mariam Qureshi
(74) *Attorney, Agent, or Firm* — Anova Law Group, PLLC

(57) ABSTRACT

Display device and fabrication method are provided. The display device includes a first substrate and a flexible circuit board. The first substrate includes a step region, first alignment marks, and a base substrate. The step region includes a bonding region and the bonding region includes a plurality of first pads arranged in at least one row along a first direction. The flexible circuit board is bonded in the bonding region and includes second alignment marks. Orthographic projections of the first alignment marks on a plane of the base substrate do not overlap an orthographic projection of the flexible circuit board on the plane of the base substrate, and do not overlap orthographic projections of the second alignment marks on the plane of the base substrate.

22 Claims, 13 Drawing Sheets

(51) Int. Cl.
*G02F 1/1362* (2006.01)
*H05K 1/18* (2006.01)
(58) Field of Classification Search
CPC .............. G04G 9/0041; G04G 9/0094; H05K 2201/10136; H05K 1/189
See application file for complete search history.

(56) References Cited

U.S. PATENT DOCUMENTS

| | | | | |
|---|---|---|---|---|
| 2017/0168463 | A1* | 6/2017 | Hong | G04G 9/0064 |
| 2019/0096291 | A1* | 3/2019 | Wei | H05K 1/189 |
| 2019/0293998 | A1* | 9/2019 | Hasegawa | G02F 1/133528 |
| 2019/0393277 | A1* | 12/2019 | An | H01L 23/544 |

FOREIGN PATENT DOCUMENTS

| | | |
|---|---|---|
| CN | 208722489 U | 4/2019 |
| CN | 109709731 A | 5/2019 |
| CN | 209231642 U | 8/2019 |
| CN | 110579917 A | 12/2019 |

* cited by examiner

DISPLAY DEVICE AND FABRICATION METHOD THEREOF

CROSS-REFERENCES TO RELATED APPLICATION

This application claims the priority of Chinese Patent Application No. 201911322256.3, filed on Dec. 20, 2019, the content of which is incorporated herein by reference in its entirety.

TECHNICAL FIELD

The present disclosure generally relates to the field of display technology and, more particularly, relates to a display device and a fabrication method.

BACKGROUND

Substrate of display devices include liquid crystal substrate, organic light emitting substrate, or plasma substrate. To increase quality of displayed images and appearance of a display device, increasing a screen ratio of the display device has gradually become a development trend. Existing display devices include monitors, televisions, mobile phones, tablets, or computers. In recent years, wearable devices have become more and more popular among users because of many advantages including portability and stylish appearance.

Substrate of wearable devices have a growing demand for narrow frames, and a lower step region cannot be narrowed in a lateral direction. One of the main limitations is the ability of the flexible circuit board bonding machine to recognize alignment marks. Generally, a minimum recognizable distance of the lenses in the flexible circuit board bonding machine is a fixed value, and a distance between the two alignment marks on a flexible circuit board cannot be less than this fixed value, and finally the lower step region in the lateral direction cannot be narrowed.

The display device and fabrication method are directed to solve one or more problems set forth above and other problems.

SUMMARY

One aspect of the present disclosure provides a display device. The display device includes a first substrate and a flexible circuit board. The first substrate includes a step region, first alignment marks, and a base substrate. The step region includes a bonding region and the bonding region includes a plurality of first pads arranged in at least one row along a first direction. The flexible circuit board is bonded in the bonding region through the plurality of first pads and includes second alignment marks. Orthographic projections of the first alignment marks on a plane of the base substrate do not overlap an orthographic projection of the flexible circuit board on the plane of the base substrate, and do not overlap orthographic projections of the second alignment marks on the plane of the base substrate.

Another aspect of the present disclosure provides a driving method for a display device. The fabrication method includes: providing a first substrate including a step region and first alignment marks, where the step region includes a bonding region including a plurality of first pads arranged in at least one row along a first direction; providing a flexible circuit board including second alignment marks; aligning the flexible circuit board with the first substrate; and bonding the flexible circuit board with the first substrate by using the plurality of first pads. Aligning the flexible circuit board with the first substrate includes: placing the flexible circuit board and the first substrate in a bonding machine including an image capturing device composed of a first image capturing device and a second image capturing device, where a position of the first substrate is kept unchanged; using the first image capturing device to capture images of the first alignment marks, and determine a first coordinate $(X_1, Y_1)$ of each first alignment mark, wherein the flexible circuit board does not cover the first alignment marks; using the second image capturing device to capture images of the second alignment marks, and determine a second coordinate $(X_2', Y_2')$ of each second alignment mark; and moving the flexible circuit board to move each second alignment mark to a position of a second coordinate $(X_2, Y_2)$ with $X_2-X_1=dx$ and $Y_2-Y_1=dy$, where dx is a preset difference between a horizontal coordinate $X_1$ of the first alignment mark and a horizontal coordinate $X_2$ of the corresponding second alignment mark, and dy is a preset difference between a vertical coordinate $Y_1$ of the first alignment mark and a vertical coordinate $Y_2$ of the corresponding second alignment mark.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
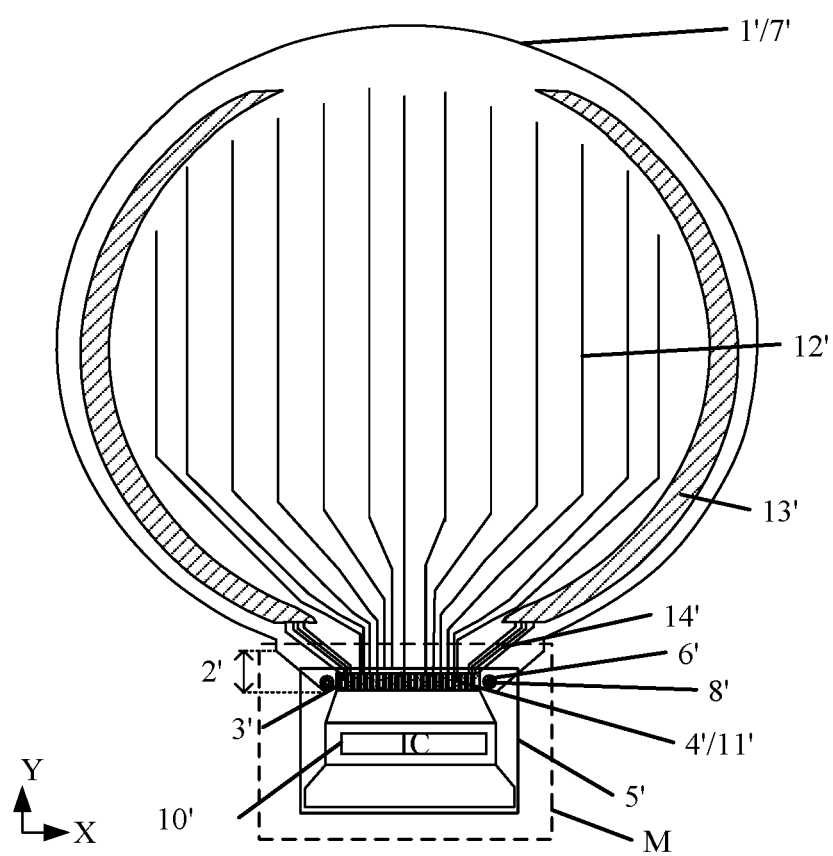
FIG. 1 illustrates a display device.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

A step region cannot be narrowed in existing technologies.

Figure 2:
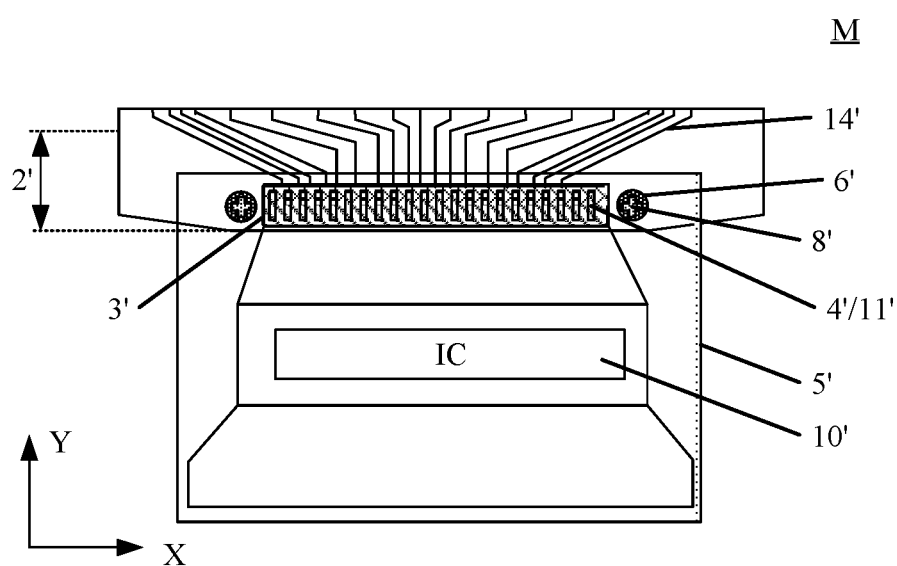
FIG. 2 illustrates an enlarged view of an M region in FIG. 1.

FIG. 1 illustrates a display device and FIG. 2 illustrates an enlarged view of an M region in FIG. 1. The display device 000 in FIG. 1 is a smart wearable device including a smart watch. The display device 000 includes a first substrate 1'. The first substrate 1' is circular. The first substrate 1' includes a step region 2' and the step region 2' includes a bonding region 3'. The bonding region 3' includes a plurality of first pads 4' arranged along a first direction X. The first substrate 1' further includes a plurality of data lines 12' arranged along the first direction X and extending along a second direction Y. Shift register circuits 13' are disposed at two sides of the display device 000. The shift register circuits 13' is electrically connected to the plurality of first pads 4' in the bonding region 3' through peripheral lines 14. As illustrated in FIG. 1 and FIG. 2, the display device 000 further includes a flexible circuit board 5'. The flexible circuit board 5 includes second pads 11'. The second pads 11' correspond to the plurality of first pads 4' in a one-to-one correspondence. The flexible circuit board 5' includes a driving chip 10', and signals are transmitted to the first substrate 1' from the driving chip 10' or to the driving chip 10' from the first substrate 1' through the second pad 11' and the plurality of first pad 4'. The first substrate 1' includes first alignment marks 6', and the flexible circuit board 5' includes second alignment marks 8'. In this case, generally, the first alignment marks 6' have recesses and the second alignment marks 8' have bumps. When the flexible circuit board 5' is bonded, the second alignment marks 8' are engaged with the first alignment marks 6' indicating that the alignment matches, and then the bonding is completed.

To match an overall shape, a lower frame of the smart wearable device including is narrow both in the first direction X and the second direction. The smart wearable device may be circular or rectangular. When the smart wearable device is circular, the lower frame in the first direction X is narrower. Since the second alignment marks 8' are engaged with the first alignment marks 6', the first alignment marks 6' occupy a large area and a narrow frame is hard to be formed in the first direction X. A minimum recognizable distance of lenses in a bonding machine is about 5 mm and radius of the lenses are about 2.5 mm. Correspondingly, when narrowing the bonding region 3' in the first direction, a distance between two first alignment marks 6' cannot be less than 5 mm no matter whether a number of the lenses is one or two. The above two factors severely limit the realization of a narrow frame in the first direction X.

The present disclosure provides a display device and a fabrication method thereof to at least partially alleviate above problems.

Figure 3:
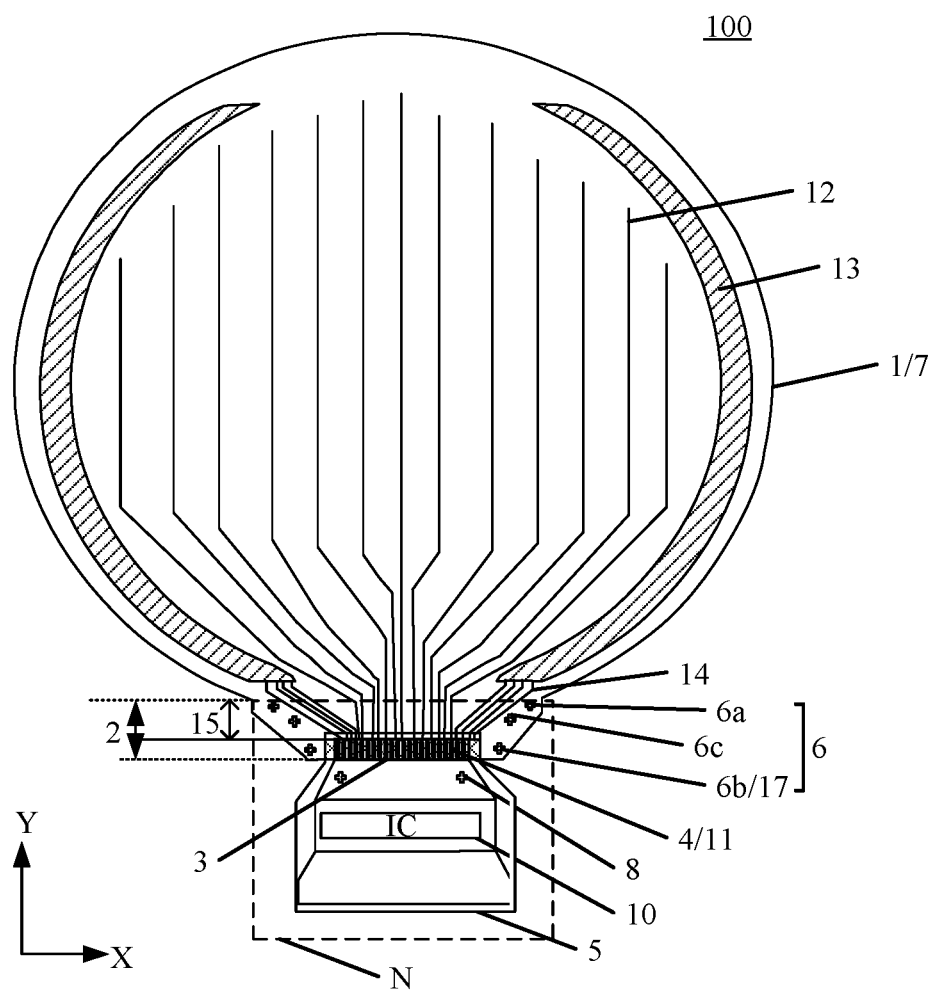
FIG. 3 illustrates an exemplary display device consistent with various disclosed embodiments in the present disclosure.
Figure 4:
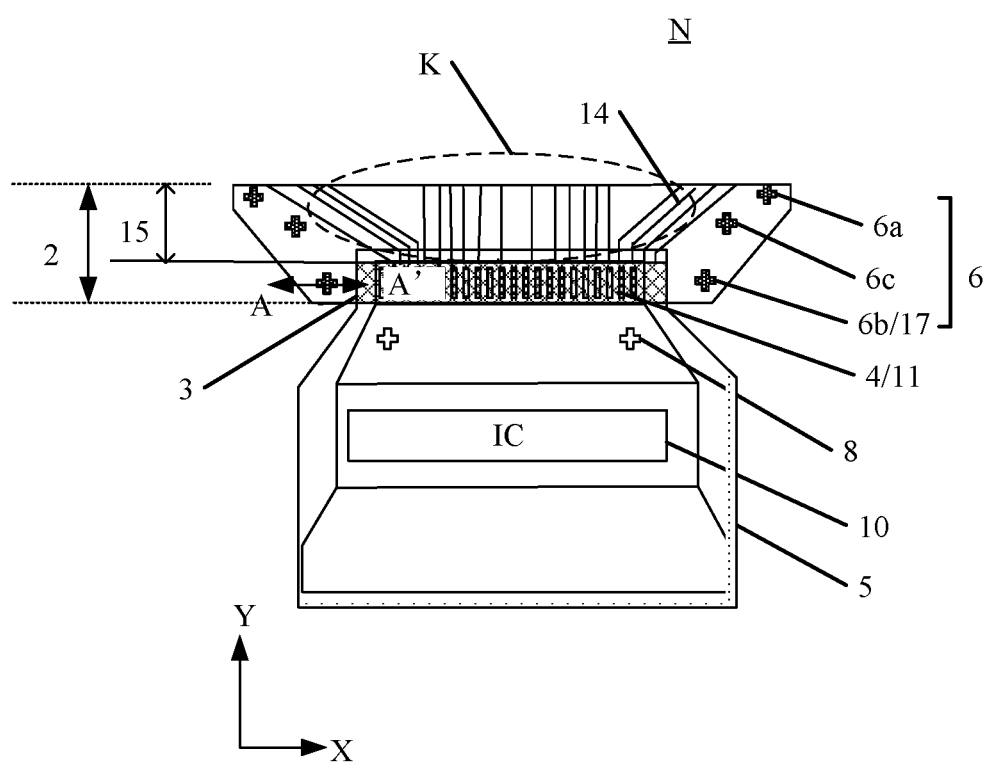
FIG. 4 illustrates an enlarged view of an N region in FIG. 3.

The present disclosure provides a display device. FIG. 3 illustrates an exemplary display device consistent with various disclosed embodiments in the present disclosure; and FIG. 4 illustrates an enlarged view of an N region in FIG. 3. The display device 100 in FIG. 3 may be a smart wearable device including a smart watch. The display device 100 may include a first substrate 1. The first substrate 1 may be circular and may include a step region 2. The step region 2 may include a bonding region 3. The bonding region 3 may at least include a plurality of first pads 4 arranged in a line along a first direction X. The display device 100 may further include a flexible circuit board 5 which is bonded in the bonding region 3 through the plurality of first pads 4. The first substrate 1 may include first alignment marks 6 and a base substrate 7. The flexible circuit board 5 may include second alignment marks 8. Orthographic projections of the first alignment marks 6 to a plane of the base substrate 7 may not overlap an orthographic projection of the flexible circuit board 5 to the plane of the base substrate 7, and may not overlap orthographic projections of the second alignment marks 8 to the plane of the base substrate 7.

As illustrated in FIG. 3, the first substrate 1 may further include a plurality of data lines 12 arranged along the first direction X and extending along a second direction Y. Shift register circuits 13 may be disposed at two sides of the display device 100. The shift register circuits 13 may be electrically connected to the plurality of first pads 4 in the bonding area through peripheral lines 14. As illustrated in FIG. 4, the display device 100 may further include second pads 11. The second pads 11 may correspond to the plurality of first pads 4 in a one-to-one correspondence. The flexible circuit board 5 may include a driving chip 10. Signals may be transmitted from the driving chip 10 to the first substrate 1 or from the first substrate 1 to the driving chip 10 through the second pads 10 and the plurality of pads 4.

To match an overall shape, a lower frame of the smart wearable device including is narrow both in the first direction X and the second direction. The smart wearable device may be circular or rectangular. When the smart wearable device is circular, the lower frame in the first direction X is narrower.

The flexible circuit board 5 here may be a chip-on-film (COF) as shown in FIG. 3 and FIG. 4, that is a chip soft film that fixes a driving chip (IC) on a flexible circuit board. A soft additional circuit board may be used as a chip packaging carrier to combine the chip with a flexible substrate circuit. In some embodiment, the flexible circuit board 5 may be a soft additional circuit board without packaging chips. In other embodiments, the flexible circuit board 5 may also have no driver chip. The driving chip may be disposed on the base substrate 7 directly, which is referred to as a COG technology.

As illustrated in FIG. 3 showing positions of the first alignment marks 6, the first alignment marks 6a and 6c may be disposed at two sides of a fan-out routing area K in the first direction X. The two sides of the fan-out routing area K in the first direction X may be blank areas originally without other parts. The display device may also use other original alignment marks in other display devices. In one embodiment illustrated in FIG. 3, the first alignment marks 6b may be original alignment marks in the first substrate. In the present embodiment in FIGS. 3-4, it may be not necessary to engage the first alignment marks 6 with the second alignment marks 8, and there is no need to make an area of the first alignment marks 6 larger than an area of the second alignment marks 8. The first alignment marks 6 also may not be disposed in the bonding region 3. Space along the first direction X may be released.

Figure 5:
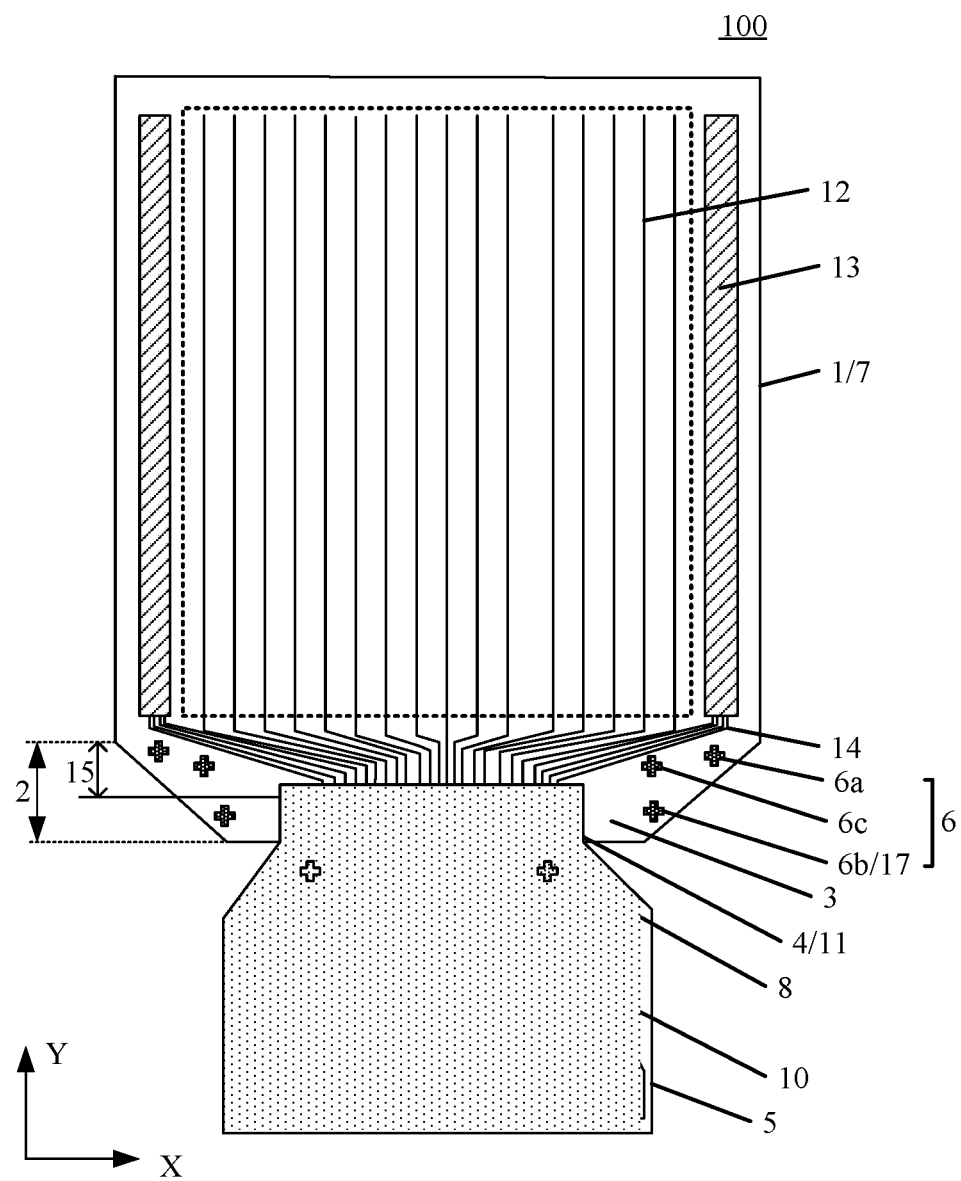
FIG. 5 illustrates another exemplary display device consistent with various disclosed embodiments in the present disclosure.

Another embodiment of the present disclosure provides another display device illustrated in FIG. 5. The first substrate 1 in FIG. 5 may be rectangular and may include a step region 2. The step region 2 may include a bonding region 3. The bonding region 3 may at least include a plurality of first pads 4 arranged in a line along a first direction X. The display device 100 may further include a flexible circuit board 5 which is bonded in the bonding region 3 through the plurality of first pads 4. The first substrate 1 may include first alignment marks 6 and a base substrate 7. The flexible circuit board 5 may include second alignment marks 8. Orthographic projections of the first alignment marks 6 to a plane of the base substrate 7 may not overlap an orthographic projection of the flexible circuit board 5 to the plane of the base substrate 7, and may not overlap orthographic projections of the second alignment marks 8 to the plane of the base substrate 7.

The orthographic projections of the first alignment marks 6 to a plane of the base substrate 7 may not overlap the orthographic projection of the flexible circuit board 5 to the plane of the base substrate 7. Since the flexible circuit board 5 may be black generally, it may be ensured that the first alignment marks 6 is not covered and can be aligned because the orthographic projections of the first alignment marks 6 to a plane of the base substrate 7 may not overlap the orthographic projection of the flexible circuit board 5 to the plane of the base substrate 7. Since the orthographic projections of the first alignment marks 6 to a plane of the base substrate 7 may not overlap the orthographic projections of the second alignment marks 8 to the plane of the base substrate 7, the first alignment marks 6 may be disposed in blank areas in the step region 2 outside the bonding region 3, such as line areas in FIG. 3. Other original marks in the first substrate 1 may also be used as the first alignment marks 6. The space in the first direction X may be released and a narrow frame in the first direction X may be achieved. Further, a distance between two first alignment marks 6 and a distance between two second alignment marks 8 may not be restricted, and lenses in a bonding machine can catch them. Correspondingly, there is no need to set a distance between two alignment marks larger than 5 mm to achieve lens catch although a radius of the lens may be larger than or equal to 5 mm.

In the present disclosure, the first alignment marks 6 may not be disposed in the bonding region 3, such as line areas in FIG. 3. The space in the first direction X may be released. It may be ensured that the first alignment marks 6 is not covered and can be aligned because the orthographic projections of the first alignment marks 6 to a plane of the base substrate 7 may not overlap the orthographic projection of the flexible circuit board 5 to the plane of the base substrate 7. Since the orthographic projections of the first alignment marks 6 to a plane of the base substrate 7 may not overlap the orthographic projections of the second alignment marks 8 to the plane of the base substrate 7, the first alignment marks 6 may be disposed in blank areas in the step region 2 outside the bonding region 3. Other original marks in the first substrate 1 may also be used as the first alignment marks 6. The space in the first direction X may be released and a narrow frame in the first direction X may be achieved. Further, a distance between two first alignment marks 6 and a distance between two second alignment marks 8 may not be restricted, and lenses in a bonding machine can catch them. Correspondingly, there is no need to set a distance between two alignment marks larger than 5 mm to achieve lens catch although a radius of the lens may be larger than or equal to 5 mm.

As illustrated in FIGS. 3-5, the step region 2 may further include a first sub-region 15. An orthographic projection of the first sub-region 15 to the plane of the base substrate 7 may not overlap an orthographic projection of the bonding region 3 to the plane of the base substrate 7. The first alignment marks 6 (6a and 6c) may be disposed in the first sub-region 15.

As illustrated in FIGS. 3-5, the peripheral lines 14 may be disposed in the first sub-region 15. It may be only required that the orthographic projections of the first alignment marks 6 to a plane of the substrate 1 does not overlap orthographic projections of the peripheral lines 14 to the plane of the substrate 1. It may be unnecessary to form forbidden areas for the first alignment marks 6. Correspondingly, areas of the first alignment marks 6 on the substrate 1 may be reduced and the first alignment marks 6 may be disposed in the blank area of the first sub-region 15.

In the present disclosure, the first alignment marks 6 may be disposed in the blank area of the first sub-region 15 instead of in the bonding region 3. Correspondingly, the space of the bonding region in the first direction X may be released and the narrow frame in the first direction X may be achieved.

Figure 6:
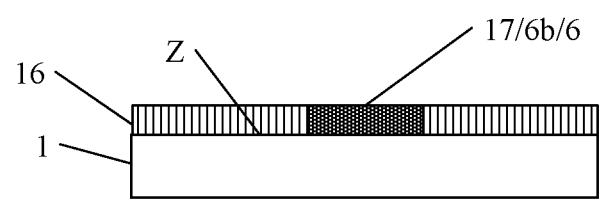
FIG. 6 illustrates a cross-section view of the display device along an A-A' direction in FIG. 4 consistent with various disclosed embodiments in the present disclosure.

As illustrated in FIG. 4 and FIG. 6 which is a cross-section view along an A-A' direction in FIG. 4, in one embodiment, the display device may further include a polarizer 16 at a side of a light emitting surface Z of the first substrate 1. The polarizer 16 may include third alignment marks 17. The third alignment marks 17 may be multiplexed as the first alignment marks 6.

In some embodiment, the display device 100 may be a liquid crystal display device, and the liquid crystal device generally may include the polarizer 16. The polarizer 16 may absorb light in a direction perpendicular to a polarization axis, and transmit only light in the direction of the polarization axis, to convert natural light into linearly polarized light. When bonding the polarizer 16 to the first substrate 1, an alignment may be also performed using the alignment marks and the alignment marks may be disposed on the polarizer 16. In the present disclosure, the alignment marks on the polarizer 16 (that is, the third alignment marks 17) may be multiplexed as the first alignment marks 6. It may be unnecessary to form the first alignment marks 6 in the bonding region. Correspondingly, the space of the bonding region in the first direction X may be released and the narrow frame in the first direction X may be achieved.

For description purposes only, the previous embodiment where the alignment marks on the polarizer 16 (that is, the third alignment marks 17) may be multiplexed as the first alignment marks 6 is used as an example to illustrate the present disclosure, and should not limit the scopes of the present disclosure. In various embodiments, any other suitable original alignment marks in the display device may be multiplexed.

Figure 7:
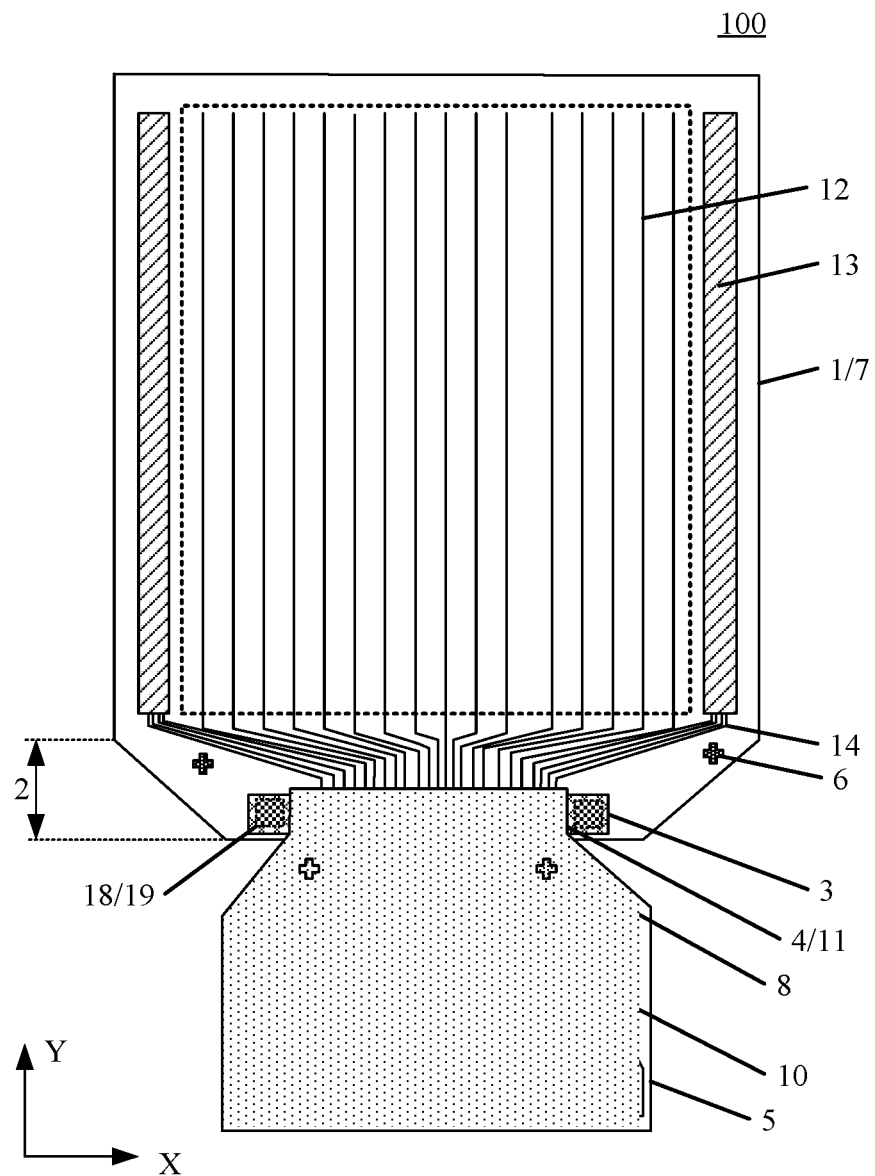
FIG. 7 illustrates another exemplary display device consistent with various disclosed embodiments in the present disclosure.

Another embodiment of the present disclosure provides another display device illustrated in FIG. 7. As illustrated in FIG. 7, the bonding region 3 in the display device may further include blank regions 18 at sides of the plurality of bonding pads 4 along the first direction X.

In the present disclosure, the first alignment marks which originally are disposed at the sides of the plurality of bonding pads 4 in the existing technology may be disposed at other positions, and correspondingly the regions at the sides of the plurality of bonding pads 4 along the first direction X may be the blank regions 18. The space of the bonding region in the first direction X may be released and the narrow frame in the first direction X may be achieved. The released space of the bonding region 3 may be a space of the blank regions 18.

As illustrated in FIG. 7, a two-dimensional code 19 of the display device 100 may be disposed in the blank regions 18. Each display device may have its corresponding ID when it leaves the factory, that is, the two-dimensional code 19. The two-dimensional code 19 may need to occupy a relatively large space. If the two-dimensional code 19 is too small, it is difficult to read the content when scanning the two-dimension code and the two-dimensional code information cannot be identified. Correspondingly, the two-dimensional code 19 may need to occupy a relatively large space. Generally, a separate space may be set up on the display device to accommodate the two-dimensional code 19. In the present disclosure, since the first alignment marks 6 occupying a large space may be not placed in the bonding region 3, the two-dimensional code 19 may be placed in the blank regions 18, and no additional space may be required to set the two-dimensional code 19. The space in the first direction X can be effectively used.

Figure 8:
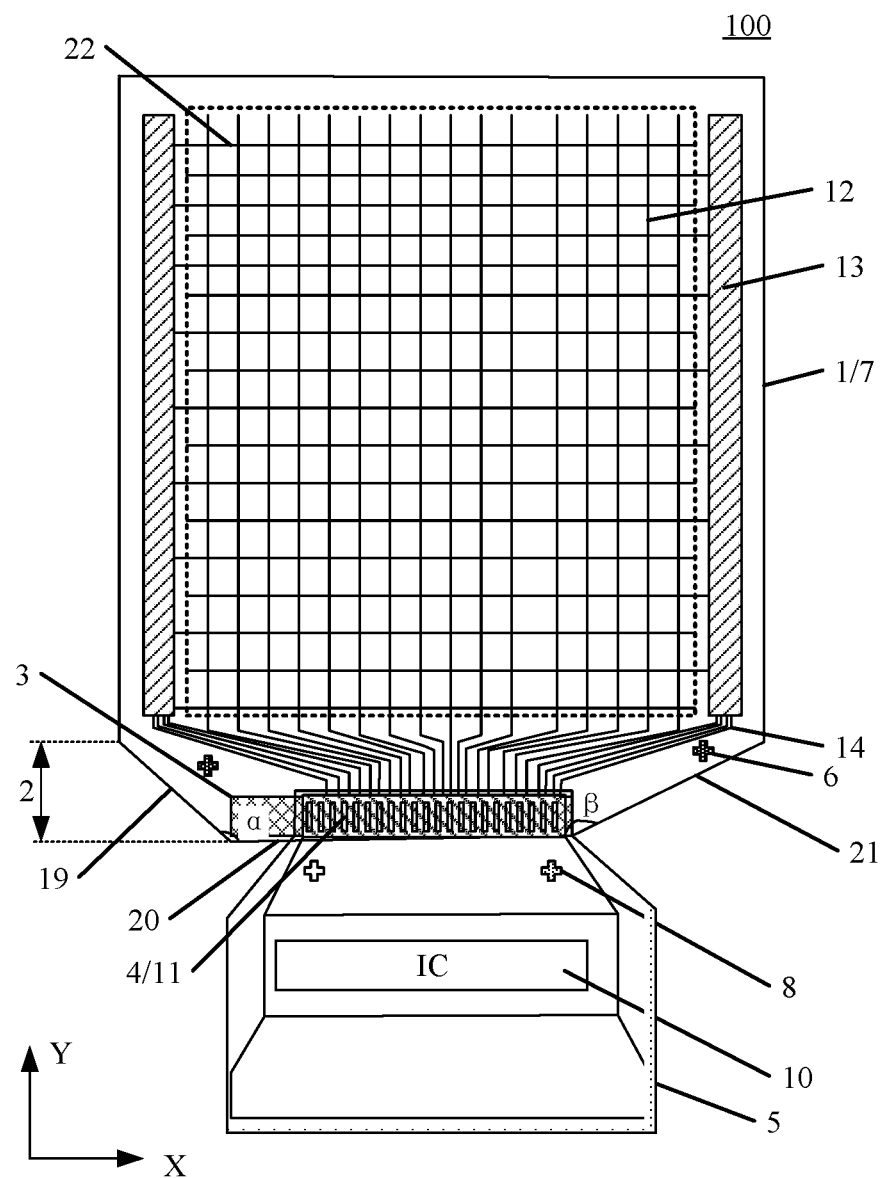
FIG. 8 illustrates another exemplary display device consistent with various disclosed embodiments in the present disclosure.

Another embodiment of the present disclosure provides another display device illustrated in FIG. 8. As illustrated in FIG. 8, the first substrate 1 in the display device may further include a plurality of scanning lines 22 arranged in a second direction Y and extending along a first direction X. The step region 2 may further include a first edge 19, a second edge 20, and a third edge 21 connected sequentially. The second edge 20 may be parallel to the plurality of scanning lines 22. The first edge 19 and the second edge 20 may form a first angle α. The third edge and the second edge 20 may form a second angle β. The first angle α may be smaller than the second angle β. In fact, the first substrate 1 in the display device may further include a plurality of thin film transistors, and each of the plurality of thin film transistors may include a gate, a source and a drain. Each of the plurality of scanning lines 22 connects to the gate, and each of data lines 12 connects to the source, in a corresponding thin film transistor of the plurality of thin film transistors.

The step region 2 may be cut to form certain angles, that is, the first angle α between the first edge 19 and the second edge 20, and the second angle β between the third edge and the second edge 20. Compared to the existing technology where the first alignment marks are disposed in the bonding region 3 at the sides of the plurality of first pads 4, in the present disclosure, the first alignment marks may not be disposed in the bonding region 3, correspondingly the original space in the bonding region 3 occupied by the first alignment marks may be released and removed to achieve the narrow frame. Also, the released space may be removed to increase a C angle. As illustrated in FIG. 8, in one embodiment, a released space of the bonding region 3 at a right side of the plurality of first pads 4 may be cut away, and the first angle α may be smaller than the second angle β. In other embodiments, a released space of the bonding region 3 at a left side of the plurality of first pads 4 may be cut away, and the first angle α may equal to the second angle β.

In the present disclosure, cutting angles of the step region may be increased and the angle between the third edge and the second edge may be also increased.

As illustrated in FIGS. 3-5, FIG. 7 or FIG. 8, the orthographic projection of the second alignment marks 8 to the plane of the base substrate 7 may not overlap the orthographic projection of the plurality of first pads 4 to the plane of the base substrate 7.

The second alignment marks 8 may be disposed between the driving circuit 10 and second pads 11. The orthographic projection of the second alignment marks 8 to the plane of the base substrate 7 may not overlap the orthographic projection of the plurality of first pads 4 to the plane of the base substrate 7.

Characteristics of the second alignment marks 8 may need to be distinctive and correspondingly the second alignment marks 8 may be quickly identified when the lenses in the bonding machine capture the second alignment marks 8. A number of the plurality of first pads 4 may be too large and may have no distinctive characteristics. If the orthographic projection of the second alignment marks 8 to the plane of the base substrate 7 overlaps the orthographic projection of the plurality of first pads 4 to the plane of the base substrate 7, the lenses in the bonding machine may not capture the second alignment marks 8 easily.

In the present disclosure, the orthographic projection of the second alignment marks 8 to the plane of the base substrate 7 may not overlap the orthographic projection of the plurality of first pads 4 to the plane of the base substrate 7. Correspondingly, the lenses in the bonding machine may capture the second alignment marks 8 easily and a bonding efficiency may be improved.

Figure 9:
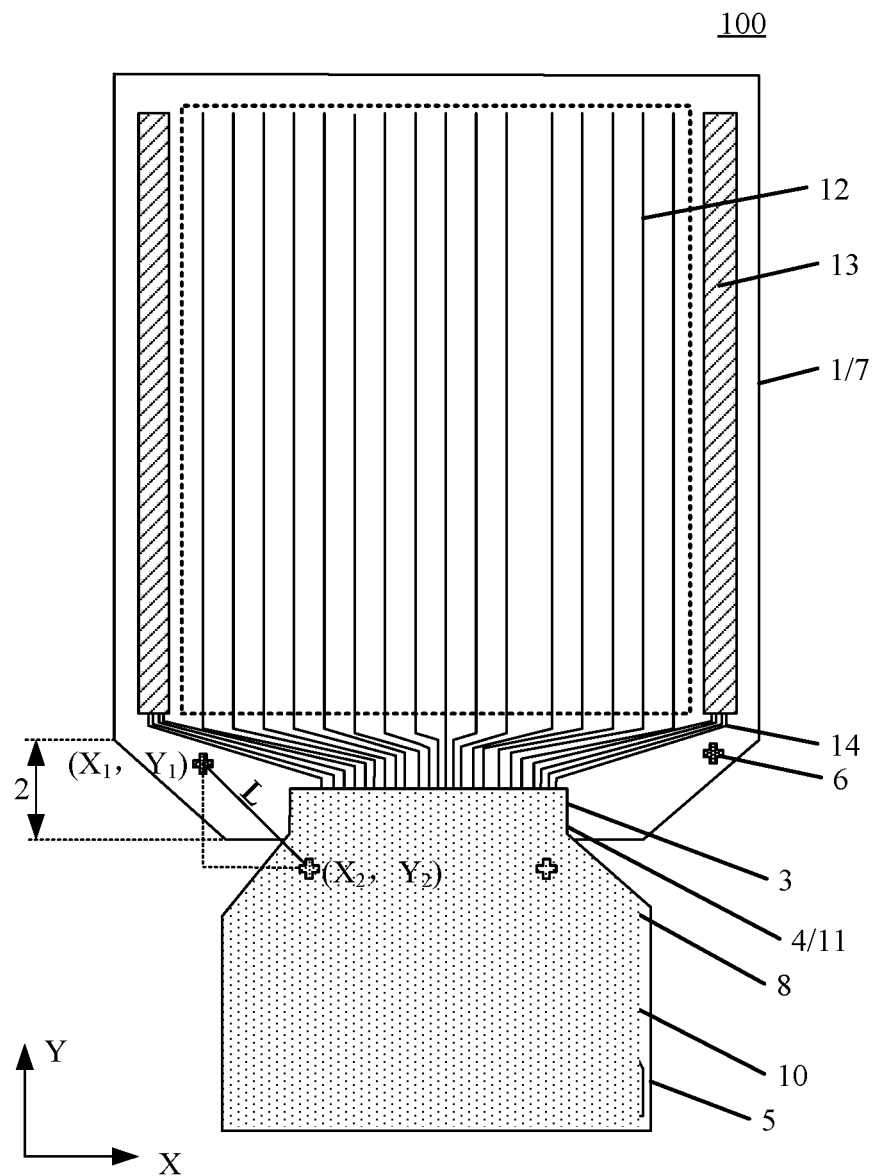
FIG. 9 illustrates another exemplary display device consistent with various disclosed embodiments in the present disclosure.

Another embodiment of the present disclosure provides another display device illustrated in FIG. 9. As illustrated in FIG. 9, in the display device, a distance L between the orthographic projection of the first alignment marks 6 to the plane of the base substrate 7 and the orthographic projection of the second alignment marks 8 to the plane of the base substrate 7 may be $L=\sqrt{dx^2+dy^2}$ where dx is a preset difference between horizontal coordinates $X_1$ of the first alignment marks 6 and horizontal coordinates $X_2$ of the second alignment marks 8, and dy is a preset difference between vertical coordinates $Y_1$ of the first alignment marks 6 and vertical coordinates $Y_2$ of the second alignment marks 8.

In the present embodiment, the coordinates of the first alignment marks 6 may be $(X_1, Y_1)$, and the coordinates of the second alignment marks 8 may be $(X_2, Y_2)$. The first alignment marks 6 and the second alignment marks 8 may be in a same coordinate system. In this coordinate system, the difference between the horizontal coordinates $X_1$ of the first alignment marks 6 and the horizontal coordinates $X_2$ of the second alignment marks 8 may be preset to dx, and the difference between the vertical coordinates $Y_1$ of the first alignment marks 6 and the vertical coordinates $Y_2$ of the second alignment marks 8 may be preset to dy.

In some embodiments, L may be smaller than 5 mm.

In the present disclosure, the distance L between the orthographic projection of the first alignment marks 6 to the plane of the base substrate 7 and the orthographic projection of the second alignment marks 8 to the plane of the base substrate 7 may be smaller than 5 mm, and the orthographic projection of the first alignment marks 6 to the plane of the base substrate 7 may not overlap the orthographic projection of the second alignment marks 8 to the plane of the base substrate 7. Correspondingly, A lens in the bonding machine may capture the first alignment marks 6 and the second alignment marks 8 simultaneously. When using one lens to capture the first alignment marks 6 and the second alignment marks 8 simultaneously, a capturing accuracy may be reduced because of a wide-angle distortion of the lens. By setting the distance L between the orthographic projection of the first alignment marks 6 to the plane of the base substrate 7 and the orthographic projection of the second alignment marks 8 to the plane of the base substrate 7 to be smaller than 5 mm, that is, setting a straight distance between the first alignment marks 6 and the second alignment marks 8 to be smaller than a visual field of the lens, an influence of the wide-angle distortion of the lens may be reduced and the alignment accuracy may be improved.

Figure 10:
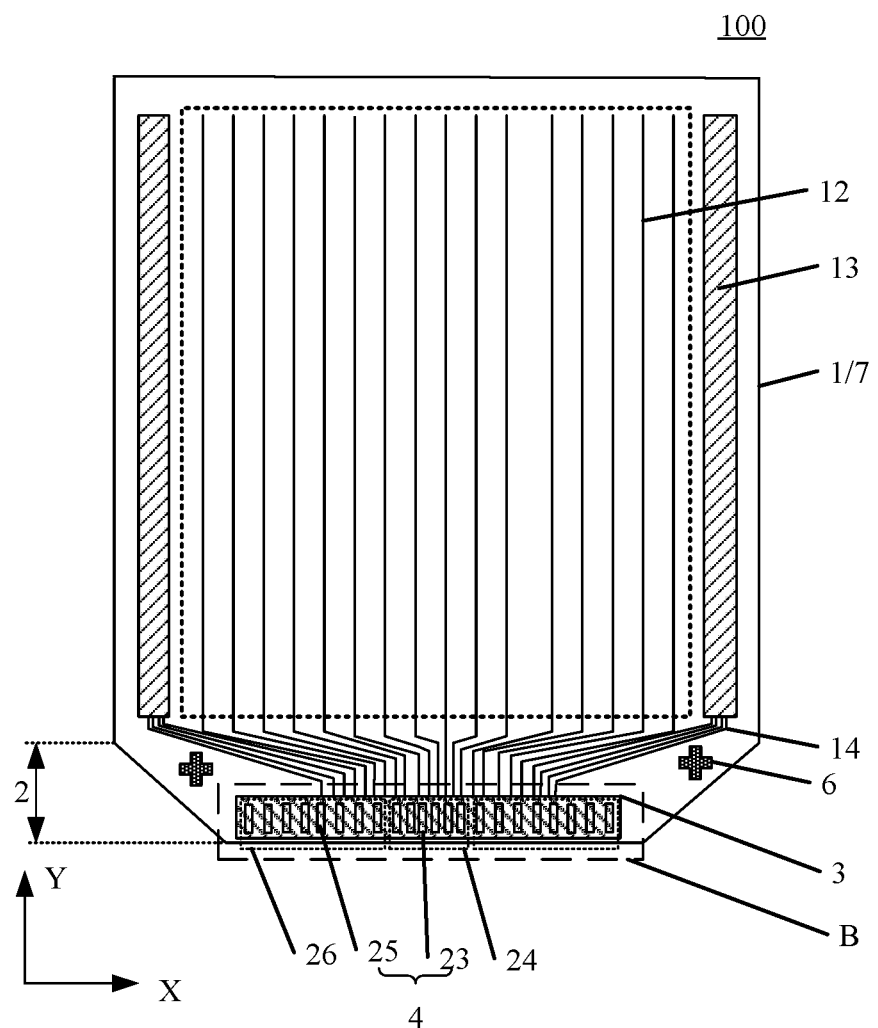
FIG. 10 illustrates another exemplary display device consistent with various disclosed embodiments in the present disclosure.
Figure 11:
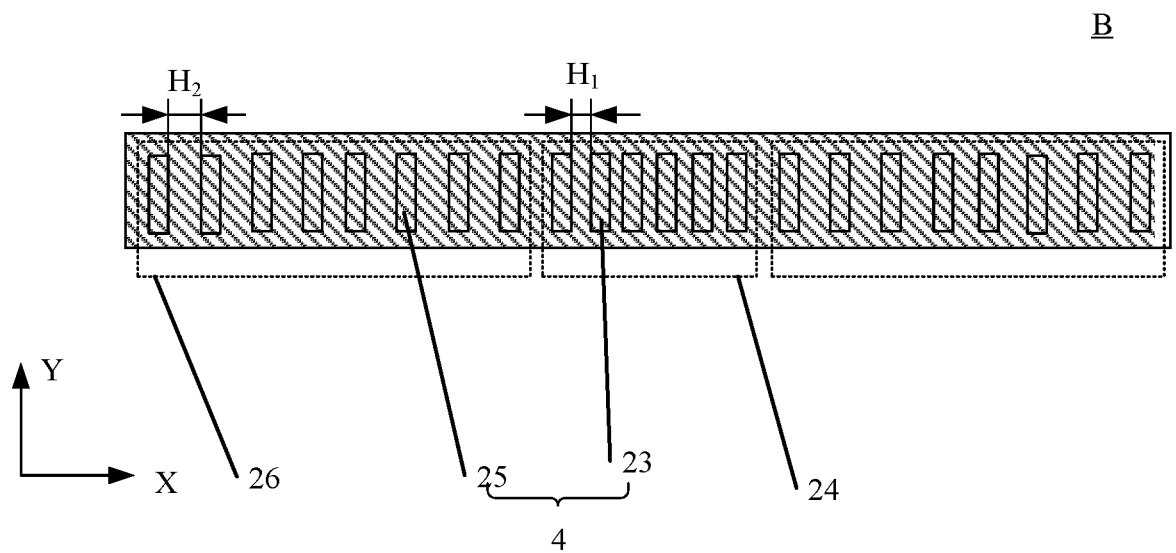
FIG. 11 illustrates an enlarged view of a B-region of the display device in FIG. 10 consistent with various disclosed embodiments in the present disclosure.
Figure 12:
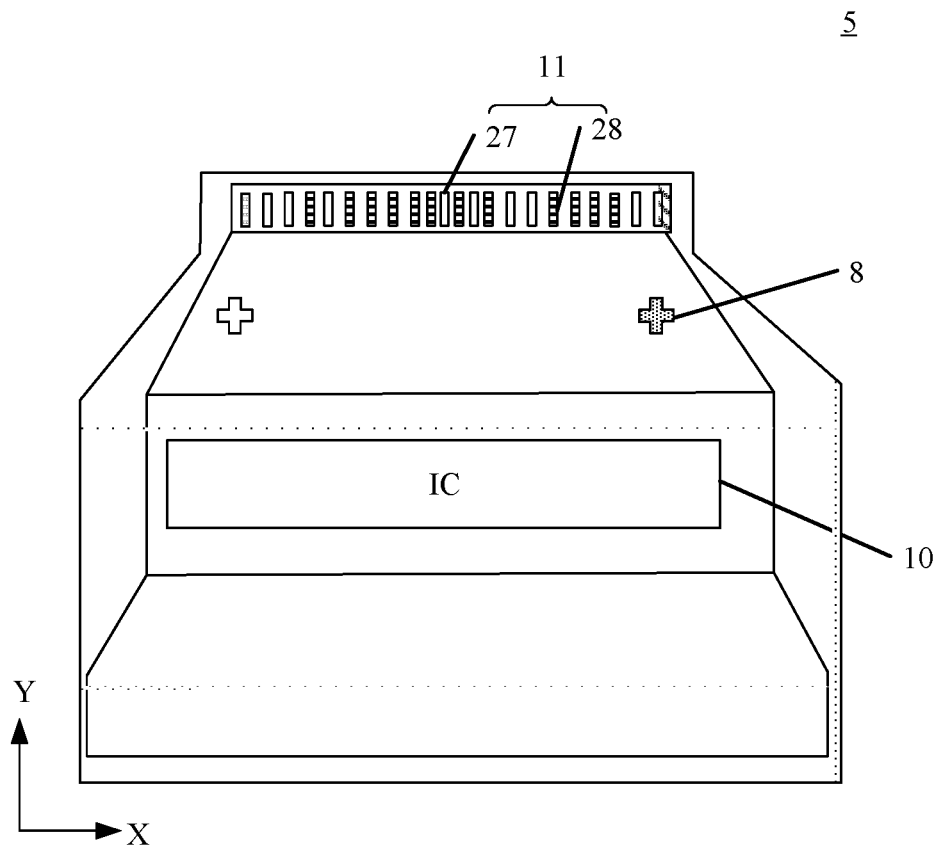
FIG. 12 illustrates an exemplary flexible circuit board consistent with various disclosed embodiments in the present disclosure.

Another embodiment of the present disclosure provides another display device illustrated in FIG. 10 and FIG. 11. FIG. 11 illustrates an enlarged view of a B region in FIG. 10. As illustrated in FIGS. 10-11, the plurality of first pads 4 may include first pads A 23 and first pads B 25. The first pads A 23 may extend along the second direction Y, and the second direction Y may cross the first direction X. At least one first pads A 23 may form a first pad A group 24. A plurality of first pads B 25 may form second pad B groups 26. Two second pad B groups 26 may be disposed at sides of the first pad A group 25.

A distance H1 between two first pads A 23 may be smaller than a distance H2 between two first pads B 25.

To clearly illustrate a structure and position of the plurality of first pads 4, a structure of the flexible circuit board is not shown in FIG. 10.

In one embodiment, a width of each of the plurality of first pads 4 in the first direction X may be same. For description purposes only, the embodiment illustrated in FIGS. 10-11 with the first pads A 23 and the first pads B 25 is used as an example to illustrate the present disclosure and should not limit the scopes of the present disclosure.

In the present disclosure, the first alignment marks 6 may not be disposed in the bonding region, and the space of the bonding region in the first direction X may be released. Correspondingly, a distance between adjacent first pads may be increased, and the bonding process may be facilitated.

The distance H1 between two first pads A 23 may be smaller than the distance H2 between two first pads B 25. Correspondingly, the first pads B 25 may be easy for bonding. In some other embodiments, a distance between any two adjacent first pads may be increased.

In the present disclosure, the space of the bonding region in the first direction X occupied by the first alignment marks 6 originally may be released. Correspondingly, a distance between adjacent first pads may be increased, and the bonding process may be facilitated.

As illustrated in FIGS. 10-11, along a direction from the first pad group A group 24 to the first pad group B and starting with adjacent first pad A 23 and the first pad B 25, the distance between the adjacent first pads B 25 may increase gradually.

In the present disclosure, the space of the bonding region in the first direction X occupied by the first alignment marks 6 originally may be released. Correspondingly, a distance between adjacent first pads may be increased. A good production ratio of the bonding process may be improved. An environmental temperature of the bonding process may be high, and a base material supporting the plurality of first pads 4 and a base material supporting the second pads may have different thermal expansion coefficient. Correspondingly, a distance between the adjacent first pads 4 and a distance between adjacent second pads may have different change ratio. In the present disclosure, along the direction from the first pads A 23 in the middle to outside, the distance between the adjacent first pads B 25 may increase gradually. Correspondingly, the first pads B 25 may expand outward gradually relative to the first pads A 23, and the plurality of first pads 4 may expand homogenously when the first substrate thermally expands. That is an overall change tendency of the distance between the plurality of first pads 4 in the thermally expanded state may be consistent with that before expansion. In the bonding process that bonding the first substrate 1 and the flexible circuit board, a one-to-one correspondence between the plurality of first pads 4 and the second pads may be achieved by adjusting a relative position between the first substrate 1 and the flexible circuit board, that is, by moving the second pads 4 up, down, left or right relative to the plurality of first pads 4. A distance change of the plurality of first pads 4 in the first substrate 1 after thermal expansion may be consistent with a distance change of the second pads in the flexible circuit board after thermal expansion, to match incoming materials and process tolerance in the bonding process. Correspondingly, a misalignment between the plurality of first pads 4 and the second pads may be reduced, and the good production ratio of the bonding process may be improved effectively.

As illustrated in FIGS. 10-11, in one embodiment, the distance between the adjacent first pads B 25 may increase gradually in an arithmetic sequence.

In the present disclosure, the space of the bonding region in the first direction X occupied by the first alignment marks 6 originally may be released. Correspondingly, a distance between adjacent first pads may be increased. A good production ratio of the bonding process may be improved. An environmental temperature of the bonding process may be high, and a base material supporting the plurality of first pads 4 and a base material supporting the second pads may have different thermal expansion coefficient. Correspondingly, a distance between the adjacent first pads 4 and a distance between adjacent second pads may have different change ratio. In the present disclosure, the distance between the adjacent first pads B 25 may increase gradually in an arithmetic sequence. Correspondingly, the first pads B 25 may expand outward gradually relative to the first pads A 23, and the plurality of first pads 4 may expand homogenously when the first substrate thermally expands. That is an overall change tendency of the distance between the plurality of first pads 4 in the thermally expanded state may be consistent with that before expansion. In the bonding process that bonding the first substrate 1 and the flexible circuit board, a one-to-one correspondence between the plurality of first pads 4 and the second pads may be achieved by adjusting a relative position between the first substrate 1 and the flexible circuit board, that is, by moving the second pads 4 up, down, left or right relative to the plurality of first pads 4. A distance change of the plurality of first pads 4 in the first substrate 1 after thermal expansion may be consistent with a distance change of the second pads in the flexible circuit board after thermal expansion, to match incoming materials and process tolerance in the bonding process. Correspondingly, a misalignment between the plurality of first pads 4 and the second pads may be reduced, and the good production ratio of the bonding process may be improved effectively.

In one embodiment, as illustrated in FIGS. 3-5, FIGS. 7-11 and FIG. 12 showing an exemplary flexible circuit board, the flexible circuit board 5 may include second pads A 27 and second pads B 28. Orthographic projections of the second pads A 27 to the plane of the base substrate 7 may overlap orthographic projections of the first pads A 23 to the plane of the base substrate 7, and orthographic projections of the second pads B 28 to the plane of the base substrate 7 may overlap orthographic projections of the first pads B 25 to the plane of the base substrate 7.

The plurality of first pads 4 and the second pads 11 may have a one-to-one correspondence. The orthographic projections of the plurality of first pads 4 to the plane of the base substrate 7 may overlap orthographic projections of the second pads 11 to the plane of the base substrate 7, to achieve data transmission.

The distance H1 between two first pads A 23 may be smaller than the distance H2 between two first pads B 25, and correspondingly a distance between adjacent second pads A 27 may be smaller than a distance between adjacent second pads B 28. When the distance between the adjacent first pads B 25 may increase gradually along the direction from the first pads A 23 in the middle to outside starting at the adjacent first pads A 23 and the first pads B 25, a distance between adjacent second pads B 28 may also increase gradually. When the distance between the adjacent first pads B 25 may increase gradually in an arithmetic sequence, the distance between the adjacent second pads B 28 may increase gradually in an arithmetic sequence. The misalignment between the plurality of first pads 4 and the second pads may be reduced, and the good production ratio of the bonding process may be improved effectively.

As illustrated in FIGS. 3-5 and FIGS. 7-10, the horizontal coordinate and the vertical coordinate of each first alignment mark 6 may be coordinates of its geometrical center.

The first alignment marks 6 may not be disposed in the bonding region, correspondingly size of the first alignment marks 6 may be changed according to a fabrication space. When the space occupied by the first alignment marks 6 is large, the coordinates of each first alignment mark 6 captured by the bonding machine may be coordinates of its geometrical center. A straight-line distance between each first alignment mark 6 and one corresponding second alignment mark 8 may be calculated easily to determine whether the alignment between the first alignment marks and the second alignment marks is achieved.

Figure 13:
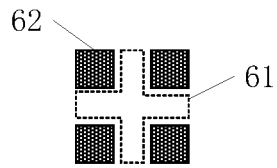
FIG. 13 illustrates an exemplary first alignment mark consistent with various disclosed embodiments in the present disclosure.
Figure 14:
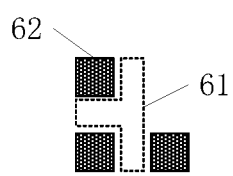
FIG. 14 illustrates another exemplary first alignment mark consistent with various disclosed embodiments in the present disclosure.
Figure 15:
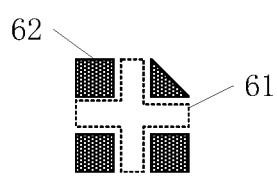
FIG. 15 illustrates another exemplary first alignment mark consistent with various disclosed embodiments in the present disclosure.
Figure 16:
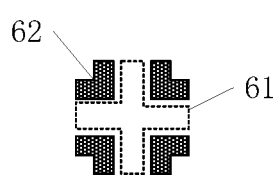
FIG. 16 illustrates another exemplary first alignment mark consistent with various disclosed embodiments in the present disclosure.

Various embodiments of the present disclosure provide different first alignment marks. FIG. 13 illustrates an exemplary first alignment mark consistent with various disclosed embodiments in the present disclosure; FIG. 14 illustrates another exemplary first alignment mark consistent with various disclosed embodiments in the present disclosure; FIG. 15 illustrates another exemplary first alignment mark consistent with various disclosed embodiments in the present disclosure; and FIG. 16 illustrates another exemplary first alignment mark consistent with various disclosed embodiments in the present disclosure. As illustrated in FIGS. 13-16, an orthographic projection of the first alignment mark to the plane of the base substrate may include a hollow part 61 and a first part 62 surrounding the hollow part 61. An orthographic projection of the hollow part 61 to the plane of the base substrate may be a crisscross shape or a T shape.

The orthographic projection of the hollow part 61 illustrated in FIG. 13, FIG. 15 and FIG. 16 to the plane of the base substrate may be a crisscross shape, while the orthographic projection of the hollow part 61 illustrated in FIG. 14 to the plane of the base substrate may be a T shape.

In the present disclosure, the first alignment marks 6 may be disposed in other blank regions in the step region instead of the bonding region, correspondingly the shape of the first alignment marks 6 may be configured arbitrarily. In the existing technologies, the alignment marks on the first substrate may be engaged with the alignment marks on the flexible circuit board, and the first alignment marks should completely match the second alignment marks. Compared to the existing technologies, the shape of the first alignment marks 6 may be configured arbitrarily as long as it is sharp and easy to distinguish. Fabrication of the first alignment marks may be easy.

Figure 17:
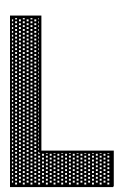
FIG. 17 illustrates another exemplary first alignment mark consistent with various disclosed embodiments in the present disclosure.

In some embodiments, the orthographic projection of each first alignment mark 6 to the plane of the base substrate may be a crisscross shape or an L shape. As illustrated in FIG. 3 and FIG. 17, the orthographic projection of the first alignment mark 6 in FIG. 3 to the plane of the base substrate may be a crisscross shape, while the orthographic projection of the first alignment mark 6 in FIG. 17 to the plane of the base substrate may be an L shape.

In the present disclosure, the first alignment marks 6 may be disposed in other blank regions in the step region instead of the bonding region, correspondingly the shape of the first alignment marks 6 may be configured arbitrarily. In the existing technologies, the alignment marks on the first substrate may be engaged with the alignment marks on the flexible circuit board, and the first alignment marks should completely match the second alignment marks. Compared to the existing technologies, the shape of the first alignment marks 6 may be configured arbitrarily as long as it is sharp and easy to distinguish. Fabrication of the first alignment marks may be easy.

Figure 18:
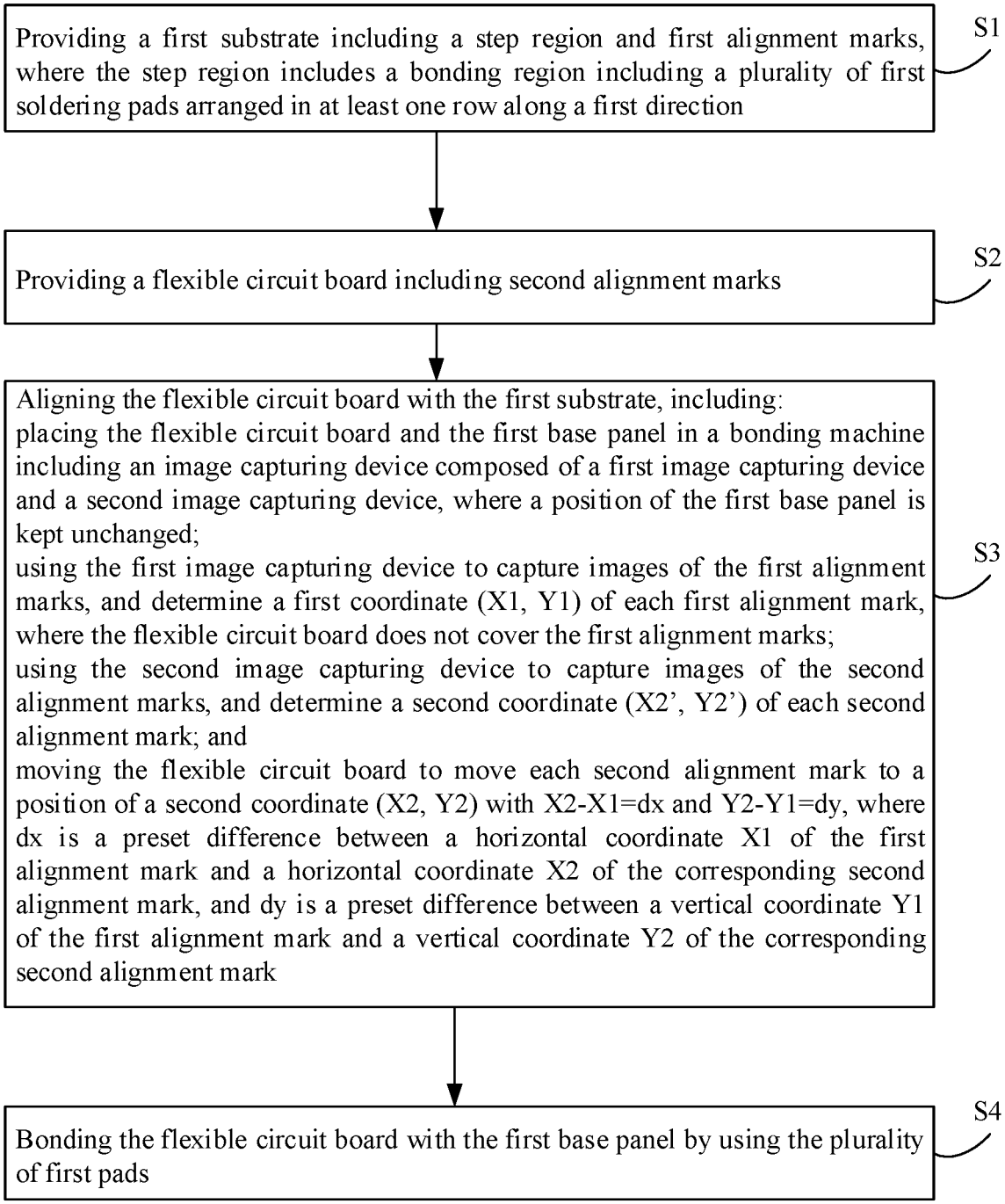
FIG. 18 illustrate an exemplary fabrication method of a display device consistent with various disclosed embodiments in the present disclosure.

The present disclosure also provides a fabrication method for a display device. As illustrated in FIG. 18, the fabrication method for a display device may include:

S1: providing a first substrate including a step region and first alignment marks, where the step region may include a bonding region, and the bonding region may include a plurality of first pads which are arranged in at least one row along a first direction;

S2: providing a flexible circuit board including second alignment marks;

S3: aligning the flexible circuit board with the first substrate; and

S4: bonding the flexible circuit board with the first substrate through the plurality of first pads.

For description purposes only, the embodiment where S1 is performed before S2 is used as an example to illustrate the present disclosure and should not limit the scopes of the present disclosure. The present disclosure has no limit on a sequence of S1 and S2.

Aligning the flexible circuit board with the first substrate may include:

placing the first substrate and the flexible circuit board on a bonding machine including an image capturing device, where the image capturing device may include a first image capturing device and a second image capturing device, and the position of the first substrate may be kept unchanged;

using the first image capturing device to capture images of the first alignment marks and determine first coordinates $(X_1, Y_1)$ of the first alignment marks;

using the second image capturing device to capture images of the second alignment marks and determine second coordinates $(X_2', Y_2')$ of the second alignment marks; and translating the flexible circuit board to move the second alignment marks to the positions with second coordinates $(X_2, Y_2)$ with $X_2-X_1=dx$ and $Y_2-Y_1=dy$ where dx may be a preset difference between the horizontal coordinates $X_1$ of the first alignment marks and the horizontal coordinates $X_2$ of the second alignment marks, dy may be a preset difference between the vertical coordinates $Y_1$ of the first alignment marks and the vertical coordinates $Y_2$ of the second alignment marks.

Figure 19:
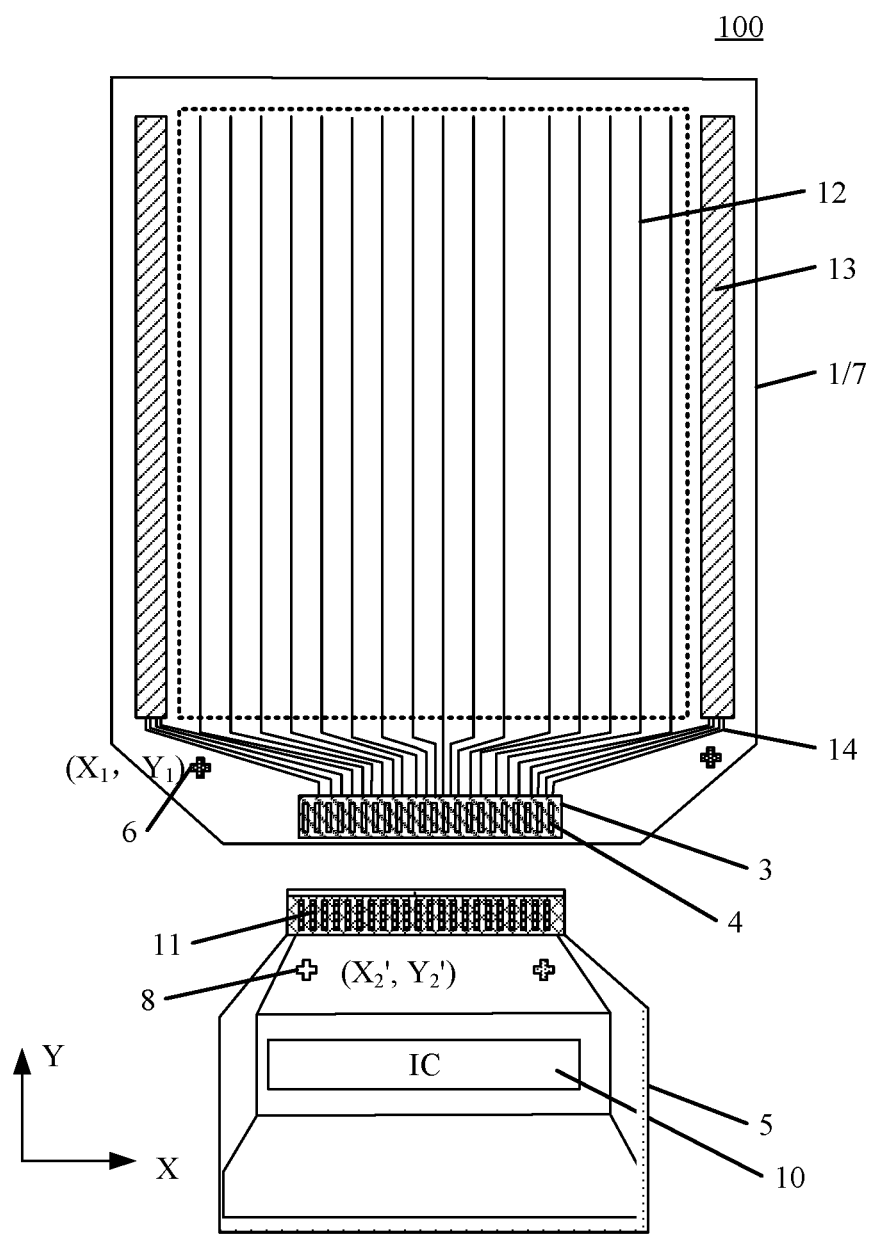
FIG. 19 illustrates an exemplary relative position relationship when aligning a first substrate with a flexible circuit board consistent with various disclosed embodiments in the present disclosure.

As illustrated in FIG. 19 and FIG. 6, where FIG. 19 illustrates a positional relationship between the first substrate and the flexible circuit board when aligning the flexible circuit board with the first substrate. The first image capturing device may be used to capture images of the first alignment marks and determine the first coordinates $(X_1, Y_1)$ of the first alignment marks; and the second image capturing device may be used to capture images of the second alignment marks and determine the second coordinates $(X_2', Y_2')$ of the second alignment marks. Then the flexible circuit board may be translated to move the second alignment marks to the positions with second coordinates $(X_2, Y_2)$ to achieve $X_2-X_1=dx$ and $Y_2-Y_1=dy$ where dx may be a preset difference between the horizontal coordinates $X_1$ of the first alignment marks and the horizontal coordinates $X_2$ of the second alignment marks, dy may be a preset difference between the vertical coordinates $Y_1$ of the first alignment marks and the vertical coordinates $Y_2$ of the second alignment marks. Correspondingly the position relationship between the first substrate and the flexible circuit board may be in a status illustrated in FIG. 6.

The image capturing device may be lenses.

Values of dx and dy may be preset. The first alignment marks and the second alignment marks may be placed in a same coordinate system. After fixing the position of the first alignment marks the coordinates of the first alignment marks may be determined. Then the second alignment marks may be moved to the second coordinates. When the difference between the horizontal coordinates $X_1$ of the first alignment marks and the horizontal coordinates $X_2$ of the second alignment marks is dx, and the difference between the vertical coordinates $Y_1$ of the first alignment marks and the vertical coordinates $Y_2$ of the second alignment marks is dy, the alignment between the first alignment marks and the second alignment marks may be successful.

The fabrication method of the present disclosure may not adopt a nesting method, and may be easy to implement and manufacture.

In some embodiments, dx and dy may not be zero simultaneously.

When dx and dy are zero simultaneously, the first alignment marks coincide with the second alignment marks. In the present disclosure, it may be necessary to ensure that the orthographic projections of the first alignment marks on the plane of the base substrate do not overlap the orthographic projection of the second alignment marks on the plane of the base substrate. Correspondingly dx and dy may not be zero simultaneously.

In some embodiments, when using the first image capturing device to capture images of the first alignment marks and determine the first coordinates $(X_1, Y_1)$ of the first alignment marks, the flexible circuit board may not cover the first alignment marks.

The flexible circuit board may generally be black. When the flexible circuit board covers the first alignment marks when using the first image capturing device to capture images of the first alignment marks and determine the first coordinates $(X_1, Y_1)$ of the first alignment marks, the first image capturing device cannot capture the first coordinates $(X_1, Y_1)$ of the first alignment marks, and the alignment of the first alignment marks with the second alignment marks cannot be completed since the first coordinates $(X_1, Y_1)$ of the first alignment marks cannot be determined. In the present disclosure, the flexible circuit board may not cover the first alignment marks, and the first image capturing device may capture the first coordinates $(X_1, Y_1)$ of the first alignment marks quickly and conveniently to complete the alignment.

In some embodiments, the first alignment marks may include a first alignment mark A and a first alignment mark B. The second alignment marks may include a second alignment mark A and a second alignment mark B.

A difference between the horizontal coordinate $X_{11}$ of the first alignment mark A and the horizontal coordinate $X_{21}$ of the second alignment mark A may be preset to dx1. A difference between the horizontal coordinate $X_{12}$ of the first alignment mark B and the horizontal coordinate $X_{22}$ of the second alignment mark B may be preset to dx2. A difference between the vertical coordinate $Y_{11}$ of the first alignment mark A and the vertical coordinate $Y_{21}$ of the second alignment mark A may be preset to dy1. A difference between the vertical coordinate $Y_{12}$ of the first alignment mark B and the vertical coordinate $Y_{22}$ of the second alignment mark B may be preset to dy2.

The first image capturing device may determine the coordinate $(X_{11}, Y_{11})$ of the first alignment mark A, and the coordinate $(X_{12}', Y_{12}')$ of the first alignment mark B.

The second image capturing device may determine the coordinate $(X_{21}, Y_{21})$ of the second alignment mark A, and the coordinate $(X_{22}', Y_{22}')$ of the second alignment mark B.

The flexible circuit board may be translated, to make the coordinate of the first alignment mark B to be $(X_{12}, Y_{12})$, and make the coordinate of the second alignment mark B to be $(X_{22}, Y_{22})$, with $dx=X_{21}-X_{11}$, $dy1=Y_{21}-Y_{11}$, $dx2=X_{22}-X_{12}$, and $dy2=Y_{22}-Y_{12}$.

Two alignment marks may be necessary to determine the position of the first substrate or the position of the flexible circuit board in the alignment process. The first alignment mark A and the first alignment mark B may be disposed at two sides of the first substrate in the first direction X, and the second alignment mark A and the second alignment mark B may be disposed at two sides of the flexible circuit board in the first direction X.

The first alignment mark A may be aligned with respect to the second alignment A, and the first alignment mark B may be aligned with respect to the second alignment B.

In the present disclosure, a difference between the horizontal coordinate $X_{11}$ of the first alignment mark A and the horizontal coordinate $X_{21}$ of the second alignment mark A may be preset to dx1. A difference between the horizontal coordinate $X_{12}$ of the first alignment mark B and the horizontal coordinate $X_{22}$ of the second alignment mark B may be preset to dx2. A difference between the vertical coordinate $Y_{11}$ of the first alignment mark A and the vertical coordinate $Y_{21}$ of the second alignment mark A may be preset to dy1. A difference between the vertical coordinate $Y_{12}$ of the first alignment mark B and the vertical coordinate $Y_{22}$ of the second alignment mark B may be preset to dy2. The flexible circuit board may be translated, to achieve $dx = X_{21}-X_{11}$, $dy1 = Y_{21}-Y_{11}$, $dx2 = X_{22}-X_{12}$, and $dy2 = Y_{22}-Y_{12}$. Alignment accuracy of the first substrate and the flexible circuit board may be improved.

In some embodiments, the first image capturing device may be multiplexed as the second image capturing device.

In the present disclosure, the first image capturing device may be multiplexed as the second image capturing device. Correspondingly, one lens may be used to capture the first coordinates of the first alignment marks and the second coordinates of the second alignment marks. The bonding efficiency of the bonding machine may be improved since one lens may be used to capture two alignment marks simultaneously.

As illustrated in FIG. 9, in the display device, a distance L between the orthographic projection of the first alignment marks 6 to the plane of the base substrate 7 and the orthographic projection of the second alignment marks 8 to the plane of the base substrate 7 may be $L=\sqrt{dx^2+dy^2}$. L may be smaller than 5 mm.

In the present disclosure, when using one lens to capture the first alignment marks 6 and the second alignment marks 8 simultaneously, a capturing accuracy may be reduced because of wide-angle distortion of the lens. By setting the distance L between the orthographic projection of the first alignment marks 6 to the plane of the base substrate 7 and the orthographic projection of the second alignment marks 8 to the plane of the base substrate 7 to be smaller than 5 mm, that is, setting a straight distance between the first alignment marks 6 and the second alignment marks 8 to be smaller than a visual field of the lens, an influence of the wide-angle distortion of the lens may be reduced and the alignment accuracy may be improved.

In the present disclosure, the first substrate of the display device may include the first alignment marks, and the flexible circuit board may include the second alignment marks. The orthographic projections of the first alignment marks on the plane of the base substrate do not overlap the orthographic projection of the flexible circuit board on the plane of the base substrate, and do not overlap the orthographic projections of the second alignment marks on the plane of the base substrate. It may be unnecessary to nest the first alignment marks with the second alignment marks. A limit on the horizontal space of the lower step region in the display device may be alleviated, and a size of the lower step region in the horizontal direction may be reduced. A distinguishing capability of the lenses in the bonding machine for the flexible circuit board may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display device, comprising:
 a first substrate, including a step region, wherein the step region includes a bonding region and a fan-out routing region, and the bonding region includes a plurality of first pads arranged in at least one row along a first direction; and
 a flexible circuit board, bonded in the bonding region through the plurality of first pads, wherein:
 the first substrate further includes first alignment marks and a base substrate, wherein the first alignment marks are located on two sides of the fan-out routing region of the step region in the first direction and orthographic projections of the first alignment marks on a plane of the base substrate do not overlap with an orthographic projection of the first pads on the plane of the base substrate;
 the flexible circuit board includes second alignment marks located on the two sides of the fan-out routing region of the step region in the first direction;
 the first alignment marks and the second alignment marks are used to align the first substrate with the flexible circuit board, respectively; and
 the orthographic projections of the first alignment marks on the plane of the base substrate do not overlap an orthographic projection of the flexible circuit board on the plane of the base substrate, and do not overlap orthographic projections of the second alignment marks on the plane of the base substrate.

2. The display device according to claim 1, wherein:
 the step region further includes a first sub-region;
 an orthographic projection of the first sub-region on the plane of the base substrate does not overlap an orthographic projection of the bonding region on the plane of the base substrate; and
 the first alignment marks are located in the first sub-region.

3. The display device according to claim 1, further including a polarizer at a side of a light-emitting surface of the first substrate, wherein the polarizer includes third alignment marks and the third alignment marks are multiplexed as the first alignment marks.

4. The display device according to claim 1, wherein:
 the bonding region includes blank regions; and
 the blank regions are located at sides of the plurality of first pads in the first direction.

5. The display device according to claim 4, wherein a two-dimensional bar code is disposed in the blank regions.

6. The display device according to claim 1, wherein the orthographic projections of the second alignment marks on the plane of the base substrate do not overlap orthographic projections of the plurality of first pads on the plane of the base substrate.

7. The display panel according to claim 1, wherein for one first alignment mark and one corresponding second alignment mark:

a distance L is between the orthographic projection of the first alignment mark on the plane of the base substrate and the orthographic projection of the corresponding second alignment mark on the plane of the base substrate, wherein $L=\sqrt{dx^2+dy^2}$, dx is a preset difference between a horizontal coordinate $X_1$ of the each first alignment mark and a horizontal coordinate $X_2$ of the corresponding second alignment mark, and dy is a preset difference between a vertical coordinate $Y_1$ of the each first alignment mark and a vertical coordinate $Y_2$ of the corresponding second alignment mark.

8. The display device according to claim 7, wherein L is smaller than 5 mm.

9. The display device according to claim 7, wherein the horizontal coordinate and the vertical coordinate of a first alignment mark are coordinates of a geometric center of the first alignment mark.

10. The display device according to claim 1, wherein:
the plurality of first pads includes first pads A and first pads B;
the first pads A extend along a second direction, the second direction intersecting the first direction;
a first pad group A includes at least one first pad A;
a first pad group B includes multiple first pads B;
two first pad groups B are located at sides of the first pad group A; and
a distance between adjacent first pads A is smaller than a distance between adjacent first pads B.

11. The display device according to claim 10, wherein:
along a direction from the first pad group A to the first pad groups B and starting at a first pad A and a first pad B adjacent to the first pad A, a distance between adjacent first pads B increases gradually.

12. The display device according to claim 10, wherein:
a distance between adjacent first pads B increases gradually in an arithmetic sequence.

13. The display device according to claim 10, wherein:
the flexible circuit board includes second pads A and second pads B;
orthographic projection of the second pads A on the plane of the base substrate overlap orthographic projection of the first pads A on the plane of the base substrate; and
orthographic projection of the second pads B on the plane of the base substrate overlap orthographic projection of the first pads B on the plane of the base substrate.

14. The display device according to claim 1, wherein:
the orthographic projection of a first alignment mark on the plane of the base substrate includes a hollow part and a first part surrounding the hollow part; and
an orthographic projection of the hollow part on the plane of the base substrate is a crisscross shape or a T shape.

15. A display device according to claim 1, wherein:
the orthographic projection of a first alignment mark on the plane of the base substrate is a crisscross shape or an L shape.

16. A display device according to claim 1, wherein:
the first alignment marks are not located in the bonding region, and the orthographic projections of the first alignment marks on the plane of the base substrate do not overlap an orthographic projection of the bonding region on the plane of the base substrate.

17. A display device according to claim 1, wherein:
orthographic projections of the second alignment marks on the plane of the base substrate do not overlap with the orthographic projection of the first pads on the plane of the base substrate.

18. A display device, comprising:
a first substrate, including a step region, wherein the step region includes a bonding region, and the bonding region includes a plurality of first pads arranged in at least one row along a first direction; and
a flexible circuit board, bonded in the bonding region through the plurality of first pads, wherein:
the first substrate further includes first alignment marks and a base substrate;
the flexible circuit board includes second alignment marks; and
orthographic projections of the first alignment marks on a plane of the base substrate do not overlap an orthographic projection of the flexible circuit board on the plane of the base substrate, and do not overlap orthographic projections of the second alignment marks on the plane of the base substrate, wherein:
the first substrate further includes a plurality of scanning lines arranged along a second direction and extending along the first direction;
the step region includes a first edge, a second edge, and a third edge that are sequentially connected one with another;
the second edge is parallel to the plurality of scanning lines;
the first edge and the second edge form a first angle;
the third edge and the second edge form a second angle; and
the first angle is smaller than the second angle.

19. The display device according to claim 18, wherein:
the step region further includes a first sub-region;
an orthographic projection of the first sub-region on the plane of the base substrate does not overlap an orthographic projection of the bonding region on the plane of the base substrate; and
the first alignment marks are located in the first sub-region.

20. The display device according to claim 18, further including a polarizer at a side of a light-emitting surface of the first substrate, wherein the polarizer includes third alignment marks and the third alignment marks are multiplexed as the first alignment marks.

21. The display device according to claim 18, wherein:
the bonding region includes blank regions; and
the blank regions are located at sides of the plurality of first pads in the first direction.

22. The display device according to claim 21, wherein a two-dimensional bar code is disposed in the blank regions.

* * * * *